(12) United States Patent
Werking

(10) Patent No.: US 8,081,030 B2
(45) Date of Patent: Dec. 20, 2011

(54) MULTI-MODE AMPLIFIER

(75) Inventor: Paul M. Werking, Rockford, MN (US)

(73) Assignee: Honeywell International Inc., Morristown, NJ (US)

(*) Notice: Subject to any disclaimer, the term of this patent is extended or adjusted under 35 U.S.C. 154(b) by 64 days.

(21) Appl. No.: 12/339,572

(22) Filed: Dec. 19, 2008

(65) Prior Publication Data

US 2010/0156385 A1   Jun. 24, 2010

(51) Int. Cl.
*H03F 3/45* (2006.01)

(52) U.S. Cl. ......................... 330/253; 330/257

(58) Field of Classification Search .......... 330/252–261; 327/512–513; 323/313
See application file for complete search history.

(56) References Cited

U.S. PATENT DOCUMENTS

| | | | |
|---|---|---|---|
| 3,582,689 A | 6/1971 | Smith et al. | |
| 4,030,043 A | 6/1977 | Hamilton | |
| 5,124,666 A * | 6/1992 | Liu et al. | 330/253 |
| 5,138,278 A | 8/1992 | Stessen | |
| 5,483,194 A | 1/1996 | Genest | |
| 5,933,055 A | 8/1999 | Dosho | |
| 6,538,503 B2 | 3/2003 | Burt | |
| 6,583,671 B2 | 6/2003 | Chatwin | |
| 6,710,655 B2 | 3/2004 | Parkhurst et al. | |
| 7,030,690 B2 | 4/2006 | Dvorak | |
| 7,215,197 B2 | 5/2007 | Regier | |
| 7,327,189 B2 | 2/2008 | Regier | |
| 7,633,330 B2 * | 12/2009 | Ogiwara et al. | 327/536 |
| 7,893,759 B1 | 2/2011 | Werking | |
| 2002/0101285 A1 | 8/2002 | Chatwin | |
| 2003/0201791 A1 | 10/2003 | Andrys et al. | |
| 2004/0125678 A1 | 7/2004 | Sinha et al. | |
| 2006/0001490 A1 | 1/2006 | Song | |
| 2006/0038614 A1 | 2/2006 | Reigier | |
| 2007/0057721 A1 | 3/2007 | Risbo et al. | |

FOREIGN PATENT DOCUMENTS

| | | |
|---|---|---|
| EP | 0 817 372 A2 | 1/1998 |
| KR | 2003 0053492 | 6/2003 |

OTHER PUBLICATIONS

Jose A. Garcia Rivera, "Design and Implementation of a Four Terminal Floating Amplifier and its Application in Analog Electronics," Master of Science in Electrical Engineering, pp. 1-167 (2005).

(Continued)

*Primary Examiner* — Hieu Nguyen
(74) *Attorney, Agent, or Firm* — Shumaker & Siffert, P.A.

(57) ABSTRACT

An amplifier capable of operating in multiple modes may include (a) first and second voltage inputs and (b) first and second current outputs that have substantially the same amplitude and polarity. Preferably, the inputs and outputs of the amplifier will have high impedances. The amplifier may operate in a first mode—and function as an operational amplifier—when the first and second current outputs are coupled together. The amplifier may operate in a second mode—and function as a type-2 current conveyor—when the second current output is coupled to the second voltage input. The amplifier may additionally include a third current output that has an amplitude that is substantially the same as the amplitudes of the first and second outputs and a polarity that is substantially opposite to the polarities of the first and second outputs. In this configuration the amplifier may function as a four-terminal floating nullor.

19 Claims, 6 Drawing Sheets

OTHER PUBLICATIONS

Shahram Minaei, et al., "New High Performance Realizations for Current-Controlled Conveyor (CCCII)," Journal of Electrical & Electronics vol. 2, No. 2 (2002).

L. Grigorescu, "Amplifiers Built With Current-Conveyors," Rom. Journ. Phys., vol. 53, Nos. 1-2 pp. 109-113 (2008).

European Search Report from corresponding EP Application No. 09173160.4, mailed Feb. 14, 2011, 5 pages.

Hussian Alzaher et al., "A CMOS Fully Balanced Four-Terminal Floating Nullor," IEEE Transactions on Circuits and Systems—I: Fundamental Theory and Applications, vol. 49, No. 4, Apr. 1, 2002, pp. 413-424.

Hanspeter Schmid, "Approximating the Universal Active Element," IEEE Transactions on Circuits and Systems—II: Analog and Digital Signal Processing, vol. 47, No. 11, Nov. 1, 2000, pp. 1160-1169.

Takao Tsukutani et al., "Novel Current-Mode Biquad Using Mo-CCCIIS and Grounded Capacitors," Proceeding of 2005 International Symposium on Intelligent Signal Processing and Communication Systems, Dec. 13-15, 2005, Hong Kong, pp. 433-436.

Masami Higashimura et al., "Realization of Current-Mode Multifunction Filters Using Multiple-Output Current Conveyors," The First IEEE Asia Pacific Conference on Seoul, Aug. 23-25, 1999, pp. 55-58.

Alain Fabre et al., "High Frequency Applications based on a New Current Controlled Conveyor," IEEE Transactions on Circuits and Systems—I: Fundamental Theory and Applications, vol. 43, No. 2, Feb. 1, 1996, pp. 82-91.

Tadic et al., "Optical Receiver With Widely Tunable Sensitivity in BiCMOS Technology," IEEE Transactions on Circuits and Systems—I: Regular Papers, vol. 55, No. 5, pp. 1223-1236, Jun. 2008.

Babaei et al, "High CMRR and Low THD Current-Mode Instrumentation Amplifier Using Current Inversion Technique," Norchip, IEEE, 4 pages, 2007.

Ghallab et al., "A Novel Current-Mode Instrumentation Amplifier Based on Operational Floating Current Conveyor," IEEE Transactions on Instrumentation and Measurement, vol. 54, No. 5, pp. 1941-1949, Oct. 2005.

Gift, "An Enhanced Current-Mode Instrumentation Amplifier," IEEE Transactions on Instrumentation and Measurement, vol. 5, No. 1, pp. 85-88, Feb. 2001.

C. Toumazou and F.J. Ledgey, "Novel Current-Mode Instrumentation Amplifier," Electronics Letters, Feb. 2, 1989, vol. 25, No. 3, 3 pages.

B. Wilson, "Universal Conveyor Instrumentation Amplifier," Electronics Letters, Mar. 30, 1989, vol. 25, No. 7, 2 pages.

Reply to communication from the Examining Division, for EP Application No. 09173160.4, dated Aug. 22, 2011, 6 pages.

* cited by examiner (a)

(b)

(a)

(b)

(c)

(d)

MULTI-MODE AMPLIFIER

GOVERNMENT RIGHTS

The United States Government has acquired certain rights in this invention pursuant to Contract No. FA8650-05-C-5707 with the Air Force Research Laboratory.

BACKGROUND

Two key analog components in integrated circuit design are the operational amplifier ("op-amp") and the type II current conveyor ("CCII"). FIG. 1(a) depicts an op-amp, which is a high-gain amplifier with two inputs and a single output. As shown, the op-amp has a positive input with a voltage $V_P$ and a current $I_P$, a negative input with a voltage $V_N$ and a current $I_N$, and an output with a voltage $V_{OUT}$ and a current $I_{OUT}$. Ideally, the impedances of the inputs are very high, such that the input currents $I_p$ and $I_N$ are zero. Further, the op-amp ideally operates as a differential amplifier that amplifies a difference between these two inputs by an open-loop gain $A_V$, which is typically very large (e.g., $A_V > 10,000$). As such, the operation of the op-amp may be represented as $V_{OUT} = A_V (V_P - V_N)$. In practice, most applications require an amplifier gain that is much less than the op-amp's open-loop gain $A_V$. As such, the op-amp is typically configured with some form of feedback such that it performs a closed-loop operation. Within this configuration, the op-amp may output a value at $V_{OUT}$ to ensure that $V_P = V_N$. Therefore, the 20 operation of the op-amp may be defined by two approximations: (1) $V_P - V_N = 0$ and (2) $I_P = I_N = 0$. There may be various different implementations of the op-amp.

FIG. 11(b) depicts a CCII, which also has two inputs and a single output. As shown, the CCII may have a positive input Y with a voltage $V_P$ and a current $I_P$, a negative input X with a voltage $V_N$ and a current $I_N$, and an output Z with a voltage $V_{OUT}$ and a current $I_{OUT}$. Ideally, the impedance of the negative input X is very low and the impedance of the positive terminal Y is very high. The operation of the CCII may then be defined by three approximations: (1) $V_N = V_P$, (2) $I_{OUT} = I_N$, and (3) $I_P = 0$. There may be various different implementations of the CCII.

While an integrated circuit designer may use the op-amp and/or the CCII to perform similar functions, op-amps and CCIIs each have respective benefits and drawbacks. In this respect, op-amps may be more appropriate for some applications, while CCIIs may be more appropriate for other applications. As such, an integrated circuit designer typically must weigh these benefits and drawbacks to decide which component to use for each new application. In turn, the integrated circuit designer's library must include both components. It would be desirable, however, to have a single analog component that functions as both an op-amp and a CCII.

SUMMARY

Unless clearly indicated by the context, different examples of the invention can be used together.

Disclosed herein as an exemplary amplifier capable of operating in multiple modes. In one aspect, the exemplary amplifier may include (a) first and second voltage inputs and (b) first and second current outputs that have substantially the same amplitude and substantially the same polarity. In this respect, the exemplary amplifier may take the form of (a) a differential amplifier circuit with an input stage that accepts the first and second voltage inputs and a first output stage that provides the first current output, and (b) a second output stage that provides the second current output, which has substantially the same amplitude and substantially the same polarity as the first current output.

The exemplary amplifier may operate in multiple modes. For example, the exemplary amplifier may operate in a first mode when the first current output and the second current output are coupled together or when one of the first and second current outputs is floating. While in the first mode, the exemplary amplifier may function as an operational amplifier. As another example, the exemplary amplifier may operate in a second mode when the second current output is coupled to the second voltage input. While in the second mode, the exemplary amplifier may function as a type-2 current conveyor.

In one example, the first voltage input and the second voltage input may each have a high impedance. In another example, the first voltage input may be a noninverting voltage input and the second voltage input may be an inverting voltage input.

In yet another example, the first current output and the second current output may each have a high impedance. In still another example, the first current output and the second current output may each be an amplified version of a difference between the first voltage input and the second voltage input.

In a further example, the exemplary amplifier may additionally include a third current output (e.g., which is provided by a third output stage) that has (a) an amplitude that is substantially the same as the amplitudes of the first and second current outputs and (b) a polarity that is substantially opposite to the polarities of the first and second current outputs. In this respect, the amplifier may function as four-terminal floating nullor when one of the first current output and the second current output is floating.

Also disclosed herein is a voltage reference circuit based on the exemplary amplifier. In the voltage reference circuit, the exemplary amplifier's first voltage input may be coupled (a) to ground via a first diode coupled in parallel with a first resistor and (b) to the first current output via a second resistor. The exemplary amplifier's second voltage input may be coupled (a) to ground via a third resistor coupled in parallel with a fourth resistor and a second diode that are coupled in series and (b) to the first current output via a fifth resistor. Within this configuration, the first and second current outputs may provide a constant bandgap current. The second current output may be coupled to ground via a sixth resistor, and a voltage across the sixth resistor may be a voltage reference.

These as well as other aspects and advantages will become apparent to those of ordinary skill in the art by reading the following detailed description, with reference where appropriate to the accompanying drawings. Further, it should be understood that the embodiments described in this summary and elsewhere are intended to be examples only and do not necessarily limit the scope of the invention.

DETAILED DESCRIPTION

Figure 1:
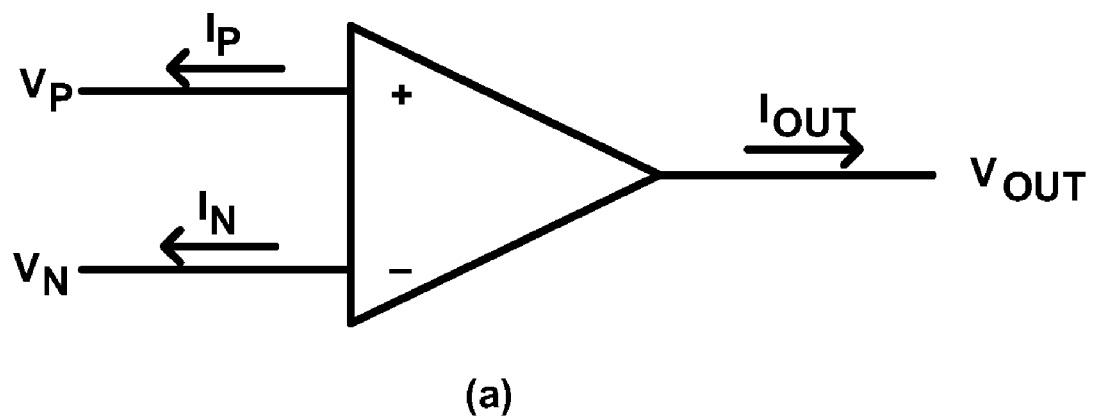
FIG. 1 depicts an operational amplifier and a type-2 current conveyor.
Figure 1:
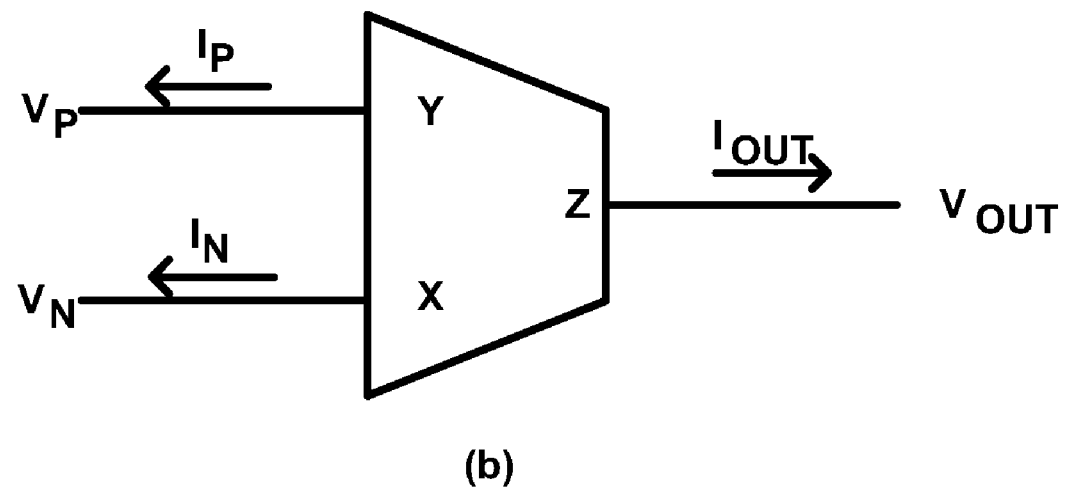

Unless clearly indicated by the context, different examples of the invention can be used together.

Disclosed herein is an exemplary amplifier that is capable of operating in multiple modes. Referring to the drawings, FIG. 2(*a*) depicts an exemplary amplifier that includes (a) first and second inputs and (b) first and second outputs. (Although FIG. 2(*a*) depicts the first exemplary amplifier using the triangular symbol commonly for the operational amplifier ("op-amp"), the first exemplary amplifier may alternatively be depicted using the symbol for the type-2 current conveyor ("CCII")). Although not shown, the first exemplary amplifier may also include first and second power inputs.

The first exemplary amplifier's first input may be a positive (i.e., noninverting) input with a voltage $V_P$ and a current $I_P$, and the exemplary component's second input may be a negative (i.e., inverting) input with a voltage $V_N$ and a current $I_N$. Preferably, the first exemplary amplifier's first and second inputs will be voltage inputs with high impedances, such that the input currents $I_P$ and $I_N$ are approximately zero.

The first exemplary amplifier's first output will preferably be a current output with a current $I_{OUT1}$, and the first exemplary amplifier's second output will preferably be a current output with a current $I_{OUT2}$. Further, the first exemplary amplifier's first and second current outputs will preferably have substantially the same amplitude (e.g., within 1%) and substantially the same polarity. To facilitate this, the first exemplary amplifier's first and second outputs may have high impedances.

The first exemplary amplifier will preferably operate to amplify a difference between the two voltage inputs by a large gain. Further, when configured with some form of feedback, the first exemplary amplifier will preferably operate to output a value at the current outputs that ensures that $V_P = V_N$. As such, the current outputs of the first exemplary amplifier may be represented as $I_{OUT1} = I_{OUT2} = G (V_P - V_N)$. Additionally, if the first and second current outputs are each coupled to a load resistor (not shown) with a resistance $R_L$, the voltage outputs of the first exemplary amplifier may be represented as $V_{OUT1} = V_{OUT2} = A_V (V_P - V_N)$, where $A_v = G * R_L$.

Figure 2:
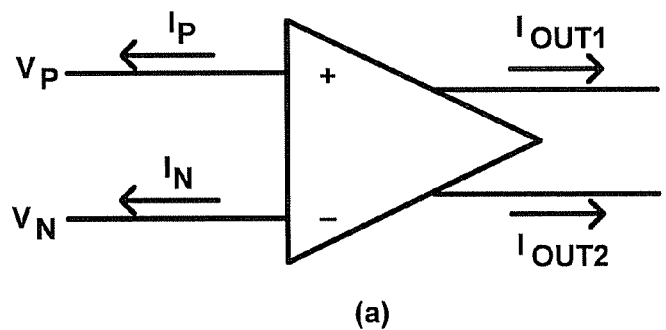
FIG. 2 depicts a first exemplary amplifier with possible configurations thereof.
Figure 2:
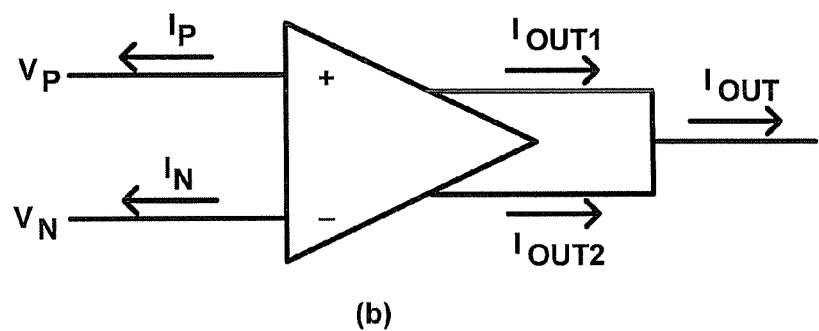
Figure 2:
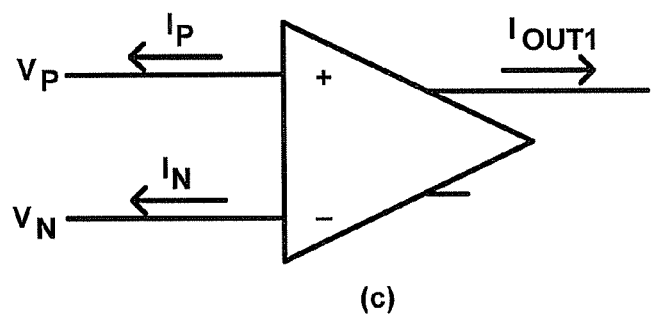
Figure 2:
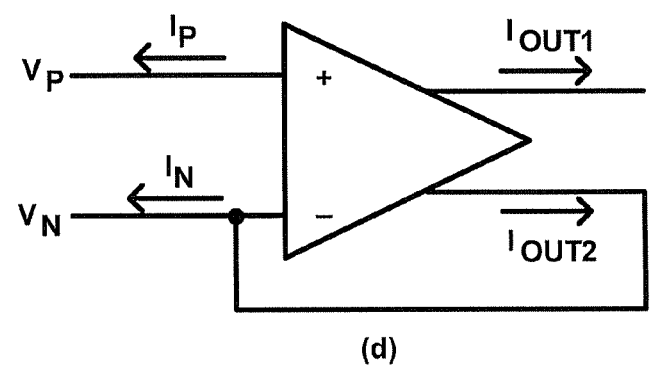

Depending on how the two matched current outputs of the first exemplary amplifier are configured, the first exemplary amplifier may then operate in multiple different modes. For example, as depicted in FIG. 2(*b*), the first exemplary amplifier may operate in a first mode when the first current output and the second current output are coupled together to form a single current output with a current $I_{OUT}$. While in the first mode, the first exemplary amplifier will preferably function as an op-amp. In this respect, the current output of the first-mode exemplary amplifier may be represented as $I_{OUT} = I_{OUT1} + I_{OUT2} = 2*G (V_P - V_N)$. Further, if the current output is coupled to a load resistor (not shown) with a resistance $R_L$, the voltage output of the first exemplary amplifier may be represented as $V_{OUT} = A_v (V_P - V_N)$, where $A_v = 2*G*R_L$. Further yet, when configured with some form of feedback, the operation of the first-mode exemplary amplifier may be defined by these two approximations: (1) $V_P - V_N = 0$ and (2) $I_P = I_N = 0$.

In another example, as depicted in FIG. 2(*c*), the first exemplary amplifier may operate in the first mode when one of the current outputs is left floating. As above, this first-mode exemplary amplifier will preferably function as an op-amp, albeit one with a lower gain. In particular, with this configuration, the current output of the first-mode exemplary amplifier may be represented as $I_{OUT} = G (V_P - V_N)$ and the voltage output may be represented as $V_{OUT} = A_v (V_P - V_N)$, where $A_v = G*R_L$. Despite this lower gain, when configured with some form of feedback, the operation of the first-mode exemplary amplifier may still be defined by the approximations $V_P - V_N = 0$ and $I_P = I_N = 0$.

In yet another example, as depicted in FIG. 2(*d*), the first exemplary amplifier may operate in a second mode when one of the current outputs (e.g., the second current output) is coupled to the second input. While in the second mode, the first exemplary amplifier will preferably function as a CCII. In this respect, the voltage inputs of the first exemplary amplifier may be substantially equal, the current at the second input may be substantially equal to the matched current outputs, and the current at the first input may be zero. As such, the operation of the second-mode exemplary amplifier may be defined by three approximations: (1) $V_N = V_{OUT2} = V_P$, (2) $I_{OUT1} = I_{OUT2} = I_N$, and (3) $I_P = 0$.

Advantageously, the first exemplary amplifier described herein may provide an integrated circuit designer with increased flexibility and efficiency. In particular, the first exemplary amplifier is a single analog component that may function as an op-amp or a CCII. As such, an integrated circuit designer may incorporate the first exemplary amplifier into a library of analog components as a replacement for the op-amp and the CCII, thus reducing library infrastructure costs. Additionally, an integrated circuit designer may implement the first exemplary amplifier in an integrated circuit without first deciding whether the op-amp or the CCII is more suitable for the integrated circuit, thus allowing the designer to focus on other design aspects of the integrated circuit. The first exemplary amplifier may provide other benefits as well, some of which are described below.

Figure 3:
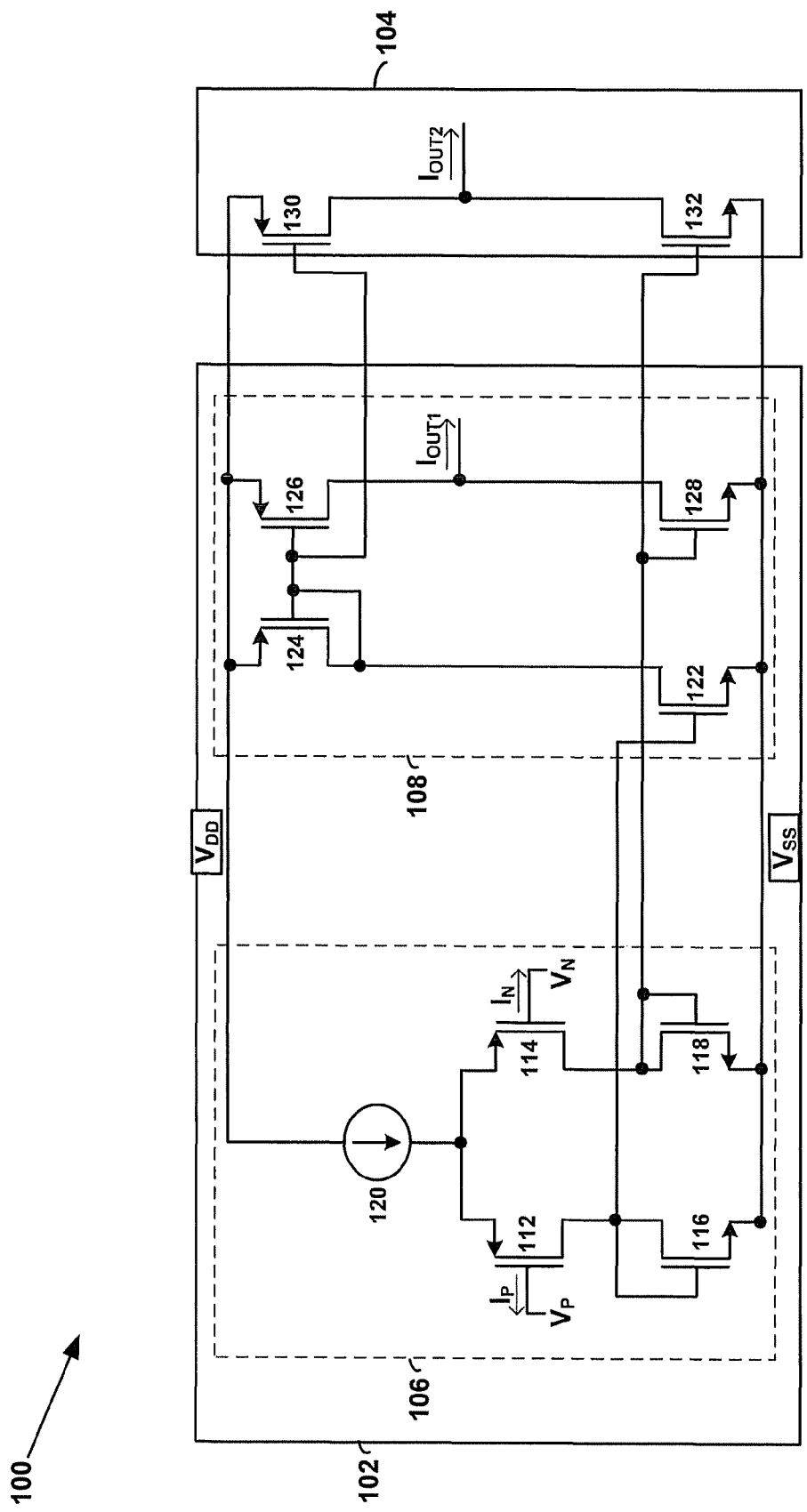
FIG. 3 depicts an implementation of the first exemplary amplifier.

As with op-amps and CCIIs, there may be various different implementations of the first exemplary amplifier. FIG. 3 depicts one such implementation of the first exemplary amplifier 100. As shown, the first exemplary amplifier 100 may take the form of (a) a differential amplifier circuit 102 and (b) a noninverting output stage 104. The first exemplary amplifier 100 may be coupled to a first voltage supply $V_{DD}$ that preferably supplies a positive voltage and a second voltage supply $V_{SS}$ that preferably supplies a negative voltage. It should be understood, however, that the voltage supplies may supply different voltage values, including voltages with opposite polarities, in which case the type of transistors described below may change (e.g., PMOS transistors may be changed to NMOS transistors and vice versa).

In general, the differential amplifier circuit 102 may be any differential amplifier circuit with an input stage that accepts two voltage inputs and an output stage that provides a current output. As shown in FIG. 3, the differential amplifier circuit 102 may have an input stage 106 and an output stage 108 It should be understood, however, that the differential amplifier circuit 102 may include other stages and components as well.

As shown, the differential amplifier's input stage 106 may include four transistors—a first transistor 112, a second transistor 114, a third transistor 116, and a fourth transistor 118— as well as a current source 120. The first transistor 112, which is preferably a PMOS transistor, may have a source coupled to the first voltage supply $V_{DD}$ via the current source 120, a drain coupled to a drain of the third transistor 116, and a gate that acts as the positive voltage input of the differential amplifier 102. Similarly, the second transistor 114, which is preferably a PMOS transistor, may have a source coupled to the first voltage supply $V_{DD}$ via the current source 120, a drain coupled to a drain of the fourth transistor 118, and a gate that acts as the negative voltage input of the differential amplifier 102. The third transistor 116, which is preferably an NMOS transistor, may have a drain coupled to the drain of the first transistor 112, a source coupled to the second voltage supply Vss, and a gate coupled to its drain. Similarly, the fourth transistor 118, which is preferably an NMOS transistor, may have a drain coupled to the drain of the second transistor 114, a source coupled to the second voltage supply Vss, and a gate coupled to its drain. As shown, the gate/drain of the third transistor 116 may act as a first output of the input stage 106, and the gate/drain of the fourth transistor 118 may act as a second output of the input stage 106.

The differential amplifier's output stage 108 may include four transistors—a fifth transistor 122, a sixth transistor 124, a seventh transistor 126, and an eighth transistor 128. The fifth transistor 122, which is preferably an NMOS transistor, may have a source coupled to the second voltage supply Vss, a drain coupled to a drain of the sixth transistor 124, and a gate coupled to the first output of the differential amplifier's input stage 106. The sixth transistor 124, which is preferably a PMOS transistor, may have a source coupled to the first voltage supply $V_{DD}$, a drain coupled to the drain of the fifth transistor 122, and a gate coupled to its drain. The seventh transistor 126, which is preferably a PMOS transistor, may have a source coupled to the first voltage supply $V_{DD}$, a drain coupled to a drain of the eighth transistor 128, and a gate coupled to the gate/drain of the sixth transistor 124. The eighth transistor 128, which is preferably an NMOS transistor, may have a drain coupled to the drain of the seventh transistor 126, a source coupled to the second voltage supply Vss, and a gate coupled to the second output of the differential amplifier's input stage 106. As shown, the coupled drains of the seventh and eighth transistors 126 and 128 may then act as the current output of the output stage 108, and thus the first current output of the first exemplary amplifier 100, providing a current $I_{OUT1}$.

The noninverting output stage 104 may function to provide a second current output with substantially the same amplitude and phase as the current output of the differential amplifier circuit 102, such as by replicating the output stage 108 of the differential amplifier circuit 102. In this respect, to replicate the differential amplifier's output stage 108, the noninverting output stage 104 may be a push-pull output stage that includes two transistors—a first transistor 130 and a second transistor 132. Preferably, the first and second transistors 130 and 132 will have substantially the same characteristics, and be placed in substantially the same configuration, as the seventh and eighth transistors 126 and 128 of the differential amplifier's output stage 108. In particular, the first transistor 130, which is preferably a PMOS transistor, may have a source coupled to the first voltage supply $V_{DD}$, a drain coupled to a drain of the second transistor 132, and a gate coupled to the gate/drain of the sixth transistor 124. The second transistor 132, which is preferably an NMOS transistor, may have a drain coupled to the drain of the first transistor 130, a source coupled to the second voltage supply Vss, and a gate coupled to the second output of the differential amplifier's input stage 106. As shown, the coupled drains of the first and second transistors 130 and 132 may then act as the current output of the noninverting output stage 104, and thus the second current output of the first exemplary amplifier 100, providing a current $I_{OUT2}$.

Figure 4:
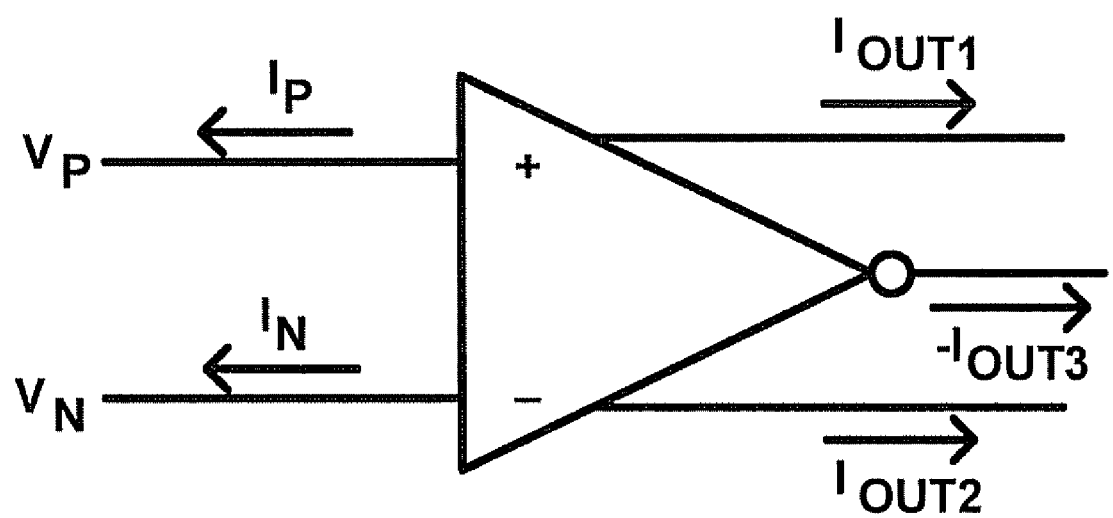
FIG. 4 depicts a second exemplary amplifier.

FIG. 4 depicts a second exemplary amplifier, which takes the form of the exemplary amplifier described above with a third output. As shown, the second exemplary amplifier's third output will preferably be a current output with a current $-I_{OUT3}$. Further, the second exemplary amplifier's third current output will preferably have substantially the same amplitude as the first and second current outputs (e.g., within 1%) but with a substantially opposite polarity. To facilitate this, the third current output may also have a high impedance.

As above, the second exemplary amplifier will preferably operate to amplify a difference between the two voltage inputs by a large gain. Further, when configured with some form of feedback, the exemplary amplifier will preferably operate to output a value at the current outputs that ensures that $V_P = V_N$. As such, the current outputs of the exemplary amplifier may be represented as $I_{OUT1} = I_{OUT2} = -I_{OUT3} = G(V_P - V_N)$. Additionally, if the first, second, and third current outputs are each coupled to a load resistor (not shown) with a resistance $R_L$, the voltage outputs of the exemplary amplifier may be represented as $V_{OUT1} = V_{OUT2} = -V_{OUT3} = A_v(V_P - V_N)$, where $A_v = G^*R_L$.

Advantageously, the second exemplary amplifier's third current output to may provide an integrated circuit designer with even more flexibility. In particular, while using one of the first and second current outputs with the third current output, the second exemplary amplifier may operate in a third mode during which it may function as a four terminal floating nullor (FTFN). As such, an integrated circuit designer may incorporate the second exemplary amplifier into a library of analog components as a replacement for the FTFN in addition to the op-amp and the CCII, thus further reducing library infrastructure costs. The second exemplary amplifier may also operate in other modes, and may thus provide other benefits as well.

Figure 5:
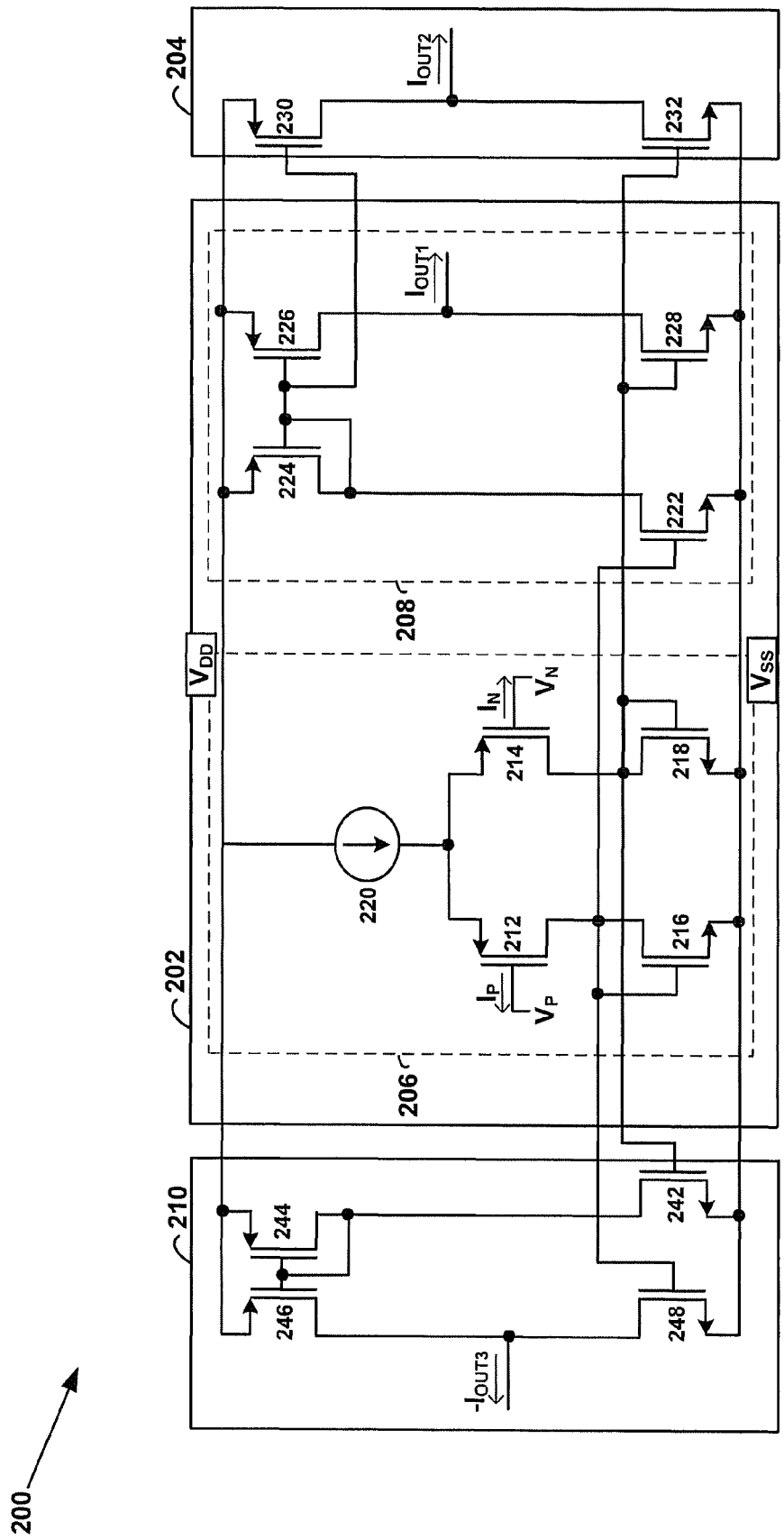
FIG. 5 depicts an implementation of the second exemplary amplifier.

FIG. 5 depicts one possible implementation of the second exemplary amplifier. Similar to the first exemplary amplifier 100 depicted in FIG. 3, the second exemplary amplifier 200 may take the form of (a) a differential amplifier circuit 202 and (b) a noninverting output stage 204. Additionally, as shown, the second exemplary amplifier 200 may include an inverting output stage 210. The second exemplary amplifier 200 may be coupled to a first voltage supply $V_{DD}$ that preferably supplies a positive voltage and a second voltage supply $V_{SS}$ that preferably supplies a negative voltage. It should be understood, however, that the voltage supplies may supply different voltage values, including voltages with opposite polarities, in which case the type of transistors described below may change (e.g., PMOS transistors may be changed to NMOS transistors and vice versa).

The differential amplifier circuit 202 may be any differential amplifier circuit with an input stage that accepts two inputs and an output stage that provides a current output. As shown, the differential amplifier circuit 202 of FIG. 5 may be substantially similar to the differential amplifier circuit 102 of FIG. 3. As such, the differential amplifier circuit 202 may have an input stage 206 and an output stage 208. It should be understood, however, that the differential amplifier circuit 202 may include other stages and components as well.

As shown, the differential amplifier's input stage 206 may include four transistors—a first transistor 212, a second transistor 214, a third transistor 216, and a fourth transistor 218—as well as a current source 220. The first transistor 212, which is preferably a PMOS transistor, may have a source coupled to the first voltage supply $V_{DD}$ via the current source 220, a drain coupled to a drain of the third transistor 216, and a gate that acts as the positive input of the differential amplifier 202. Similarly, the second transistor 214, which is preferably a PMOS transistor, may have a source coupled to the first voltage supply $V_{DD}$ via the current source 220, a drain coupled to a drain of the fourth transistor 218, and a gate that acts as the negative input of the differential amplifier 202. The third transistor 216, which is preferably an NMOS transistor, may have a drain coupled to the drain of the first transistor 212, a source coupled to the second voltage supply Vss, and a gate coupled to its drain. Similarly, the fourth transistor 218, which is preferably an NMOS transistor, may have a drain coupled to the drain of the second transistor 214, a source coupled to the second voltage supply Vss, and a gate coupled to its drain. As shown, the gate/drain of the third transistor 216 may act as a first output of the input stage 206, and the gate/drain of the fourth transistor 218 may act as a second output of the input stage 206.

The differential amplifier's output stage 208 may also include four transistors—a fifth transistor 222, a sixth transistor 224 a seventh transistor 226, and an eighth transistor 228. The fifth transistor 222, which is preferably an NMOS transistor, may have a source coupled to the second voltage supply Vss, a drain coupled to a drain of the sixth transistor 224, and a gate coupled to the first output of the differential amplifier's input stage 206. The sixth transistor 224, which is preferably a PMOS transistor, may have a source coupled to the first voltage supply $V_{DD}$, a drain coupled to the drain of the fifth transistor 222, and a gate coupled to its drain. The seventh transistor 226, which is preferably a PMOS transistor, may have a source coupled to the first voltage supply $V_{DD}$, a drain coupled to a drain of the eighth transistor 228, and a gate coupled to the gate/drain of the sixth transistor 224. The eighth transistor 228, which is preferably an NMOS transistor, may have a drain coupled to the drain of the seventh transistor 226, a source coupled to the second voltage supply Vss, and a gate coupled to the second output of the differential amplifier's input stage 206. As shown, the coupled drains of the seventh and eighth transistors 226 and 228 may then act as the current output of the output stage 208, and thus the first current output of the second exemplary amplifier 200, providing a current $I_{OUT1}$.

The noninverting output stage 204 may function to provide a second current output with substantially the same amplitude and phase as the current output of the differential amplifier circuit 202, such as by replicating the output stage 208 of the differential amplifier circuit 202. In this respect, to replicate the differential amplifier's output stage 208, the noninverting output stage 204 may be a push-pull output stage that includes two transistors—a first transistor 230 and a second transistor 232. Preferably, the first and second transistors 230 and 232 will have substantially the same characteristics, and be placed in substantially the same configuration, as the seventh and eighth transistors 226 and 228 of the differential amplifier circuit 202. In particular, the first transistor 230, which is preferably a PMOS transistor, may have a source coupled to the first voltage supply $V_{DD}$, a drain coupled to a drain of the second transistor 232, and a gate coupled to the gate/drain of the sixth transistor 224. The second transistor 232, which is preferably an NMOS transistor, may have a drain coupled to the drain of the first transistor 230, a source coupled to the second voltage supply Vss, and a gate coupled to the second output of the differential amplifier's input stage 206. As shown, the coupled drains of the first and second transistors 230 and 232 may then act as the current output of the noninverting output stage 204, and thus the second current output of the second exemplary amplifier 200, providing a current $I_{OUT2}$.

The inverting output stage 210 may then function to provide a third current output with substantially the same amplitude as the first and second current outputs, but with a substantially opposite polarity to the first and second current outputs. In this respect, as shown, the inverting output stage 210 may include four transistors—a first transistor 242, a second transistor 244, a third transistor 246, and a fourth transistor 248. The first transistor 242, which is preferably an NMOS transistor, may have a source coupled to the second voltage source $V_{SS}$, a drain coupled to a drain of the second transistor 244, and a gate coupled to the second output of the differential amplifier's input stage 206. The second transistor 244, which is preferably a PMOS transistor, may have a source coupled to the first voltage supply $V_{DD}$, a drain coupled to the drain of the first transistor 242, and a gate coupled to its drain. The third transistor 246, which is preferably a PMOS transistor, may have a source coupled to the first voltage supply $V_{DD}$, a drain coupled a drain of the fourth transistor 248, and a gate coupled to the gate/drain of the second transistor 244. The fourth transistor 248, which is preferably an NMOS transistor, may have a source coupled to the second voltage source $V_{SS}$, a drain coupled to the drain of the third transistor 246, and a gate coupled to the first output of the differential amplifier's input stage 206. As shown, the coupled drains of the third and fourth transistors 246 and 248 may then act as the current output of the inverting output stage 210, and thus the third current output of the second exemplary amplifier 200, providing a current $-I_{OUT3}$.

Figure 6:
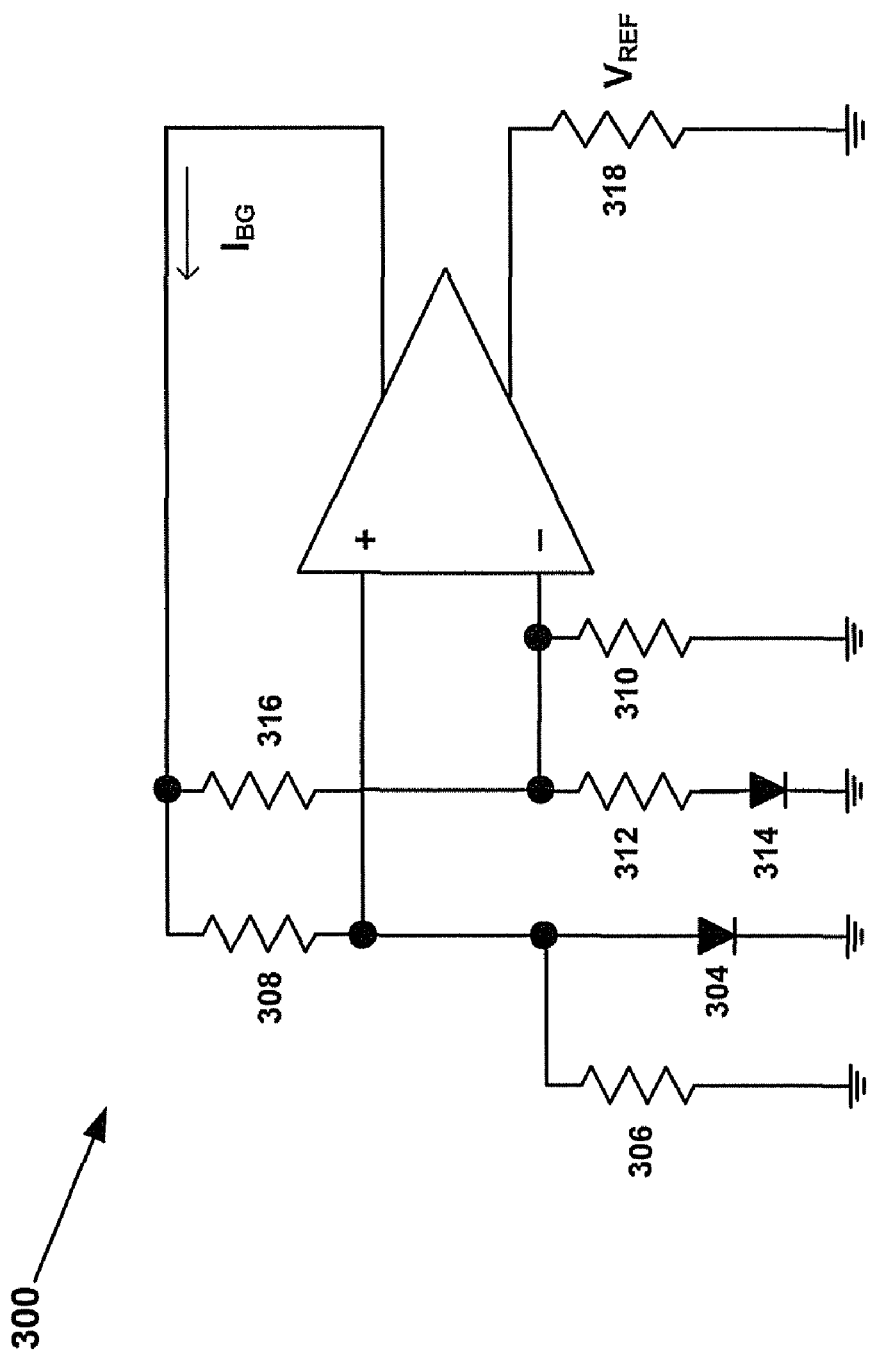
FIG. 6 depicts a voltage reference circuit based on the first exemplary amplifier.

In still another aspect, the exemplary amplifiers described herein, such as the first exemplary amplifier, may be implemented in a circuit such as a voltage reference circuit that makes use of the exemplary amplifier's two matching current outputs. FIG. 6 depicts an exemplary voltage reference circuit 300 based on the first exemplary amplifier described above. As shown, the exemplary amplifier's first input may be coupled (a) to ground via a first diode 304 and a first resistor 306, where the first diode 304 and the first resistor 306 are coupled in parallel, and (b) to the exemplary amplifier's first output via a second resistor 308. The exemplary amplifier's second input may be coupled (a) to ground via a third resistor 310 coupled in parallel with a fourth resistor 312 and a second diode 314 coupled in series and (b) to the exemplary amplifier's first output via a fifth resistor 316.

The resistors and diodes in the voltage reference circuit 300 may take a variety of forms. PREFERABLY, the resistors coupling the voltage inputs to the first current output—the second resistor 308 and the fifth resistor 316—will have a substantially similar resistance value, and the resistors coupling the voltage inputs directly to ground—the first resistor 306 and the third resistor 310—will have a substantially similar resistance value. Further, the resistors coupling the voltage inputs directly to ground will preferably have a resistance value that is approximately twice that of the resistors coupling the voltage inputs to the first current output. Further yet, the fourth resistor 312, which is coupled in series with the second diode 314, will preferably have a small resistance value relative to the other resistors in the voltage reference circuit 300. For example, the fourth resistor 312 may have a resistance value that is approximately one-fourth the resistance value of the resistors coupling the voltage inputs to the first current output, and thus approximately one-eighth the resistance value of the resistors coupling the voltage inputs directly to ground. Still further, the second diode 314 will preferably be much larger than the first diode 304. For example, the second diode 314 may be approximately eight times larger than the first diode 304. Many other examples are possible as well.

Within this configuration, the voltage reference circuit 300 may generate a constant bandgap current $I_{BG}$ at the exemplary amplifier's first current output. In turn, because the exemplary amplifier's second current output matches the first current output, the second current output may also provide constant bandgap current $I_{BG}$. As shown, this second current output may then be coupled to ground via a sixth resistor 318, and the voltage across the sixth resistor 318 may be the voltage reference output $V_{REF}$ of the voltage reference circuit 300. In this respect, the resistance value $R_{318}$ of the sixth resistor 318 may be selected such that the desired reference voltage is output. The reference voltage output may be represented as $V_{REF}=I_{BG}*R_{318}$. Preferably, this voltage reference output will be temperature stable.

Advantageously, the voltage reference circuit based on the exemplary amplifier may be more cost and power efficient than voltage reference circuits based on either op-amps or CCIIs. In particular, the voltage reference circuit based on the exemplary amplifier requires only one amplifier, whereas voltage reference circuits based on either op-amps or CCIIs typically require multiple amplifiers or conveyors. As such, the voltage reference circuit based on the exemplary amplifier may require significantly less area in an integrated circuit, and may also require significantly less power to operate.

The exemplary amplifier described herein may also be implemented in various other integrated circuits. For example, the exemplary amplifier may be used in place of an op-amp or CCII. As another example, the exemplary amplifier may be used in place of a FTFN. As yet another example, the exemplary amplifier may be used as a separate analog component with two matching current outputs and/or an inverting current output. Other examples are possible as well.

Exemplary embodiments of the present invention have been described above. Those skilled in the art will understand, however, that changes and modifications may be made to the embodiments described without departing from the true scope and spirit of the present invention, which is defined by the claims.

I claim:

1. An amplifier capable of operating in multiple modes, the amplifier comprising:
    first and second voltage inputs; and
    first and second bi-directional current outputs, wherein the first bi-directional current output and the second bi-directional current output have substantially the same amplitude and substantially the same polarity,
    wherein the amplifier operates in a first mode when the first bi-directional current output and the second bi-directional current output are coupled together, and
    wherein the amplifier operates in a second mode when one of the first bi-directional current output and the second bi-directional current output is coupled to the second voltage input.

2. The amplifier of claim 1, wherein the amplifier functions as an operational amplifier while in the first mode.

3. The amplifier of claim 1, wherein the amplifier functions as a type-2 current conveyor while in the second mode.

4. The amplifier of claim 1, wherein the amplifier also operates in the first mode when one of the first bi-directional current output and the second bi-directional current output is floating.

5. The amplifier claim 1, wherein the first voltage input and the second voltage input each have a high impedance.

6. The amplifier of claim 1, wherein the first bi-directional current output and the second bi-directional current output each have a high impedance.

7. The amplifier of claim 1, wherein the first voltage input comprises a noninverting voltage input and the second voltage input comprises an inverting voltage input.

8. The amplifier of claim 1, wherein the first bi-directional current output and the second bi-directional current output each comprise an amplified version of a difference between the first voltage input and the second voltage input.

9. The amplifier of claim 1, wherein the amplifier comprises a differential amplifier comprising an input stage that accepts the first and second voltage inputs, a first output stage that provides the first bi-directional current output, and a second output stage that provides the second bi-directional current output.

10. The amplifier of claim 1, wherein amplifier further comprises:
    a first output stage comprising a first transistor and a second transistor, the first transistor having a source coupled to a first voltage supply and a drain coupled to a drain of the second transistor, the second transistor having a source coupled to a second voltage supply, the drain of the first transistor and the drain of the second transistor acting as the first bi-directional current output; and
    a second output stage comprising a third transistor and a fourth transistor, the third transistor having a source coupled to the first voltage supply and a drain coupled to a drain of the fourth transistor, the fourth transistor having a source coupled to the second voltage supply, the drain of the third transistor and the drain of the fourth transistor acting as the second bi-directional current output.

11. The amplifier of claim 10, wherein the amplifier further comprises
    a differential input stage comprising a fifth transistor, a sixth transistor, a seventh transistor, an eighth transistor, and a current source,
    wherein the fifth transistor has a source coupled to the first voltage supply via the current source, a drain coupled to a drain of the seventh transistor, and a gate that acts as the first voltage input of the amplifier,
    wherein the sixth transistor has a source coupled to the first voltage supply via the current source, a drain coupled to a drain of the eighth transistor, and a gate that acts as the second voltage input of the amplifier,
    wherein the seventh transistor has a source coupled to the second voltage supply, and a gate coupled to the drain of the seventh transistor, the drain of the seventh transistor acting as a first output of the differential input stage,
    wherein the eighth transistor has a source coupled to the second voltage supply, and a gate coupled to the drain of the eighth transistor, the drain of the eighth transistor acting as a second output of the differential input stage,
    wherein the first differential output stage further comprises a ninth transistor and a tenth transistor,
    wherein the ninth transistor has a source coupled to the second voltage supply, a drain coupled to a drain of the tenth transistor, and a gate coupled to the first output of the differential input stage,
    wherein the tenth transistor has a source coupled to the first voltage supply, and a gate coupled to the drain of the tenth transistor,
    wherein a gate of the second transistor and a gate of the fourth transistor are both coupled to the second output of the differential input stage, and
    wherein a gate of the first transistor and a gate of the third transistor are both coupled to the gate of the tenth transistor.

12. The amplifier of claim 1,
    wherein the first voltage input is coupled to ground via a first diode and a first resistor,
    wherein the first diode is coupled in parallel with the first resistor,
    wherein the first voltage input is coupled to the first bi-directional current output via a second resistor;
    wherein the second voltage input is coupled to ground via a third resistor, a fourth resistor, and a second diode, wherein the fourth resistor is coupled in series with the second diode, wherein the third resistor is coupled in parallel with the fourth resistor and the second diode;

wherein the second voltage input is coupled to the first bi-directional current output via a fifth resistor, wherein the second bi-directional current output is coupled to ground via a sixth resistor, and wherein a voltage across the sixth resistor comprises a voltage reference.

13. The amplifier of claim 12, wherein the first bi-directional current output and the second bi-directional current output provide a constant bandgap current.

14. An amplifier capable of operating in multiple modes, the amplifier comprising:

first and second voltage inputs;

first and second bi-directional current outputs, wherein the first bi-directional current output and the second bi-directional current output have substantially the same amplitude and substantially the same polarity; and a third bi-directional current output, wherein the third bi-directional current output has an amplitude that is substantially the same as the amplitudes of the first and second bi-directional current outputs, and wherein the third bi-directional current output has a polarity that is substantially opposite to the polarities of the first and second bi-directional current outputs.

15. The amplifier of claim 14, wherein the amplifier functions as a four-terminal floating nullor when one of the first bi-directional current output and the second bi-directional current output is floating.

16. An amplifier capable of operating in multiple modes, the amplifier comprising:

first and second voltage inputs; and first and second bi-directional current outputs, wherein the first bi-directional current output and the second bi-directional current output have substantially the same amplitude and substantially the same polarity, wherein the differential amplifier operates in a first mode when the first bi-directional current output and the second bi-directional current output are coupled together, and wherein the differential amplifier operates in a second mode when one of the first bi-directional current output and the second bi-directional current output is coupled to the second voltage input.

17. The amplifier of claim 16, wherein the differential amplifier functions as an operational amplifier while in the first mode.

18. The amplifier of claim 16, wherein the differential amplifier functions as a type-2 current conveyor while in the second mode.

19. The amplifier of claim 16, wherein the first bi-directional current output and the second bi-directional current output each comprise an amplified version of a difference between the first voltage input and the second voltage input.

* * * * *

UNITED STATES PATENT AND TRADEMARK OFFICE
CERTIFICATE OF CORRECTION

| | |
|---|---|
| PATENT NO. | : 8,081,030 B2 |
| APPLICATION NO. | : 12/339572 |
| DATED | : December 20, 2011 |
| INVENTOR(S) | : Paul M. Werking |

It is certified that error appears in the above-identified patent and that said Letters Patent is hereby corrected as shown below:

In the Specification:

Col. 1, Line 33, "Fig 11(b)" should be -- Fig. 1(b) --

Signed and Sealed this
Twenty-third Day of April, 2013

Teresa Stanek Rea
*Acting Director of the United States Patent and Trademark Office*